United States Patent
Thorbeck et al.

(10) Patent No.: US 12,327,667 B2
(45) Date of Patent: Jun. 10, 2025

(54) HARMONIC SUPPRESSION IN DISPERSION RESONATORS FOR TRAVELING WAVE PARAMETRIC AMPLIFIERS

(71) Applicant: INTERNATIONAL BUSINESS MACHINES CORPORATION, Armonk, NY (US)

(72) Inventors: Ted Thorbeck, Elmsford, NY (US); Corrado P. Mancini, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 529 days.

(21) Appl. No.: 17/871,931

(22) Filed: Jul. 23, 2022

(65) Prior Publication Data

US 2024/0029932 A1    Jan. 25, 2024

(51) Int. Cl.
*H01F 19/00*   (2006.01)
*G06N 10/00*   (2022.01)
*H10N 60/12*   (2023.01)
*H10N 60/80*   (2023.01)

(52) U.S. Cl.
CPC ............. *H01F 19/00* (2013.01); *G06N 10/00* (2019.01); *H10N 60/12* (2023.02); *H10N 60/805* (2023.02)

(58) Field of Classification Search
CPC ........ H01F 19/00; G06N 10/00; H10N 60/12; H10N 60/805
See application file for complete search history.

(56) References Cited

U.S. PATENT DOCUMENTS

| | | | |
|---|---|---|---|
| 8,878,626 B2 | 11/2014 | Zmuidzinas et al. | |
| 9,369,100 B2 | 6/2016 | Tatsumi | |
| 9,806,711 B1* | 10/2017 | Abdo | H10N 60/12 |
| 10,097,143 B2 | 10/2018 | Abdo | |
| 10,291,227 B2 | 5/2019 | Abdo | |
| 10,404,214 B2* | 9/2019 | Szöcs | H10N 69/00 |
| 10,873,302 B2 | 12/2020 | Tan | |
| 11,139,783 B2 | 10/2021 | Zhou et al. | |
| 11,271,529 B1 | 3/2022 | Kok | |
| 11,424,521 B2* | 8/2022 | Whittaker | G06N 10/40 |
| 12,206,367 B2* | 1/2025 | Vesterinen | H03F 19/00 |
| 2019/0074801 A1 | 3/2019 | Tan | |

(Continued)

OTHER PUBLICATIONS

Ranadive, A. et al., "Kerr Reversal in Josephson Meta-Material and Traveling Wave Parametric Amplification"; arXiv:2101.05815v4 [quant-ph] (2022); 18 pgs.

(Continued)

*Primary Examiner* — Patricia T Nguyen
(74) *Attorney, Agent, or Firm* — Intelletek Law Group, PLLC; Gabriel Daniel, Esq.

(57) ABSTRACT

A Traveling Wave Parametric Amplifier (TWPA) transmission line with improved bandwidth includes one or more unit cell. Each unit cell includes a capacitor to a ground and a Josephson junction in series configured to provide inductance and non-linearity. One or more dispersion resonator is coupled to the transmission line. The dispersion resonator is configured to (i) use a first harmonic mode of the resonator for resonant phase matching in the transmission line and (ii) prevent a second mode of the resonator from interacting with an intermodulation product of the transmission line.

20 Claims, 7 Drawing Sheets

(56) References Cited

U.S. PATENT DOCUMENTS

| | | |
|---|---|---|
| 2019/0229690 A1* | 7/2019 | White .................... G06N 10/40 |
| 2020/0162047 A1 | 5/2020 | Bell et al. |
| 2020/0358430 A1* | 11/2020 | Tan .................... H03K 5/00006 |
| 2021/0226597 A1 | 7/2021 | Abdo |
| 2021/0265964 A1 | 8/2021 | Miano et al. |
| 2021/0305958 A1 | 9/2021 | Hassel et al. |
| 2022/0021362 A1 | 1/2022 | Roch et al. |
| 2022/0052662 A1 | 2/2022 | White et al. |
| 2022/0190798 A1 | 6/2022 | Mancini et al. |
| 2022/0311400 A1 | 9/2022 | White et al. |
| 2023/0163737 A1 | 5/2023 | Vesterinen et al. |

OTHER PUBLICATIONS

O'brien, K. et al., "Resonant Phase Matching of Josephson Junction Traveling Wave Parametric Amplifiers"; Physical Review Letters (2014); vol. 113, pp. 157001-1-157001-5.

Planat, L. et al., "Photonic-Crystal Josephson Traveling-Wave Parametric Amplifier"; Physical Review X (2020); vol. 10, pp. 021021-1-021021-19.

Navarro, J. et al., "Optimising the Design of A Broadband Josephson Junction TWPA For Axion Dark Matter Search Experiments", Proc of SPIE (2021), vol. 11881, pp. 118815-1-118815-10.

International Search Report and Written Opinion issued Oct. 16, 2023 in related application No. PCT/EP2023/070233, 11 pgs.

Ratter, K. et al.; "A Dispersion-Engineered Josephson Traveling Wave Parametric Amplifier with Periodic Impedance Perturbation", 31st International Symposium on Space Terahertz Technology, Tempe, Az, USA (2020); 4 pgs.

Kern, S. et al.; "The Transition Regime Between Traveling-Wave And Resonant Parametric Amplifier", arXiv:2203.02448v1 [cond-mat.mtrl-sci] (2022); 9 pgs.

White, T.C. et al.; "Traveling Wave Parametric Amplifier With Josephson Junctions Using Minimal Resonator Phase Matching", Applied Physics Letters (2015); vol. 106:242601, 5 pgs.

Macklin, C. et al.; "A Near-Quantum-Limited Josephson Traveling-Wave Parametric Amplifier", Science (2015); vol. 350:6258, pp. 307-310.

Van De Reep, T. H. A; "Mesoscopic Hamiltonian for Josephson Traveling-Wave Parametric Amplifiers", Physical Review (2019); vol. 99:063838, 15 pgs.

* cited by examiner

HARMONIC SUPPRESSION IN DISPERSION RESONATORS FOR TRAVELING WAVE PARAMETRIC AMPLIFIERS

BACKGROUND

Technical Field

The present disclosure generally relates to superconducting signal amplifiers.

Description of the Related Arts

A Traveling Wave Parametric Amplifier (TWPA) is a commonly used superconducting amplifier. A TWPA includes a nonlinear LC transmission line, with Josephson junctions providing the inductance and the non-linearity. TWPAs are the workhorse amplifier for some quantum computing systems, as TWPAs have high gain, low noise, and sufficient bandwidth and saturation power for readout of multiple qubits.

When a signal tone is amplified using a TWPA having a pump tone, the TWPA amplifies the signal tone by taking power from the pump tone. This is a four-wave mixing process, in which two pump photons are converted into a new photon at a signal frequency and a photon at an idler frequency. Both energy (frequency) and momentum (wavevector) are to be conserved in this process. For small signals, these two criteria can be simultaneously satisfied. However, at large pump tones, a power dependent phase shift may be created, so the wavevector criteria is no longer satisfied. To simultaneously satisfy both criteria, a resonant phase matching is introduced. Specifically, by adding microwave resonators periodically throughout the transmission line, the dispersion of the transmission line is altered such that the two criteria are simultaneously satisfied for pump tones near the frequency of the microwave resonators. These microwave resonators are referred to dispersion resonators or dispersion features, which are components added to a TWPA transmission line to add dispersion when the TWPA transmission line is used to amplify a signal.

Unfortunately, there can be an additional dip in gain that reduces the usable bandwidth of the TWPA due to the addition of the dispersion resonators. This dip is where the frequency of a second mode of the dispersion resonator phase matches a four-wave mixing process that generates higher-order intermodulation products.

SUMMARY

Some embodiments of the disclosure provide a Traveling Wave Parametric Amplifier (TWPA) transmission line with improved bandwidth. The transmission line includes one or more unit cells. Each unit cell includes a capacitor to the ground and a Josephson junction in series to provide inductance and non-linearity. One or more dispersion resonators are coupled to the transmission line. Each dispersion resonator is configured to (i) use a first harmonic mode of the resonator for resonant phase matching in the transmission line and (ii) prevent a second mode of the resonator from interacting with an intermodulation product of the transmission line. Preventing the second mode from interacting with the intermodulation products of the device and removes a dip in signal gain, thereby increasing the usable bandwidth of the TWPA. In other words, the resonator is configured to remove or suppress coupling to the second mode in a frequency range of the intermodulation product of the TWPA.

In some embodiments, a nodal coupling method is used to suppress the coupling of the second mode. Specifically, the resonator is a quarter-wave resonator that is coupled to the transmission line at a voltage-node of the second mode of the resonator via a coupling capacitor. The resonator includes, from the voltage node of the second mode, a first transmission line to the ground and a second transmission line to an open circuit. The first mode is a fundamental frequency of the resonator, and the second mode is a third harmonic of the fundamental frequency of the resonator.

In some embodiments, a transformed resonator method is used, such that the resonator is configured to detune or decouple the second mode by several GHz so that the second mode of the resonator is not aligned with the intermodulation product of the transmission line. The resonator is a one-eighth wavelength transmission line resonator that includes an inductor to the ground in parallel with an open circuit transmission line. In some embodiments, the open circuit transmission line is a transformation equivalent capacitor that act as a capacitor shunted to the ground. In some embodiments, the transformation equivalent capacitor has an effective capacitance that is determined based on (i) a characteristic impedance of the open circuit transmission line and (ii) a target dispersion frequency of the resonator, while the inductor to the ground has an inductance that is set according to the target dispersion frequency of the resonator and the effective capacitance of the transformation equivalent capacitor.

TWPAs are useful for scaling up quantum computers. By using either the nodal coupling method or the transformed resonator method, the dip in gain can be removed or pushed out of range of intermodulation (IM) products, thereby increasing the usable readout bandwidth of the TWPA. Increasing the usable readout bandwidth of the TWPA can either be used to increase the number of multiplexed qubits measured with a single TWPA or to space the readout resonators further apart to reduce crosstalk. Removing the gain dip facilitates the detuning between the readout resonators and the qubits to reduce Purcell loss in the quantum system.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The backbone of a Josephson TWPA is a non-linear transmission line. The unit cell of the transmission line includes a capacitor to ground and a Josephson junction in series to provide both inductance and nonlinearity. When a signal tone at frequency $f_s$ propagates through a TWPA being driven by a pump tone at frequency $f_p$, the TWPA amplifies the signal tone by taking power from the pump tone. This is a four-wave mixing process, in which two pump photons are converted into a new photon at a signal frequency and a photon at an idler frequency. (Idler is a microwave tone that is a result of the nonlinear amplification process; for the four-wave mixing process, the idler frequency is at $f_i = 2f_p - f_s$.)

Both energy (frequency) and momentum (wavevector) are to be conserved in this process, i.e., $2\omega_p = \omega_s + \omega_i$ and $2k_p = k_s + k_i$ ($\omega_p$, $\omega_s$, and $\omega_i$ are the angular frequencies of the pump, signal, and idler, respectively, while $k_p$, $k_s$, and $k_i$ are the wavevectors of pump, signal, and idler, respectively.) For small signals, these two criteria can be simultaneously satisfied. However, at large pump tones, a power dependent phase shift may be created, so the wavevector criteria ($2k_p = k_s + k_i$) is no longer satisfied.

To simultaneously satisfy both criteria, a resonant phase matching is introduced. Specifically, by adding microwave resonators periodically throughout the transmission line, the dispersion of the transmission line $k(\omega)$ is altered such that the two criteria (conservation of energy and momentum) are simultaneously satisfied for pump tones near the frequency of the microwave resonators. These microwave resonators are referred to dispersion resonators or dispersion features, which are components added to a TWPA transmission line to add dispersion when the TWPA transmission line is used to amplify a signal.

Figure 1:
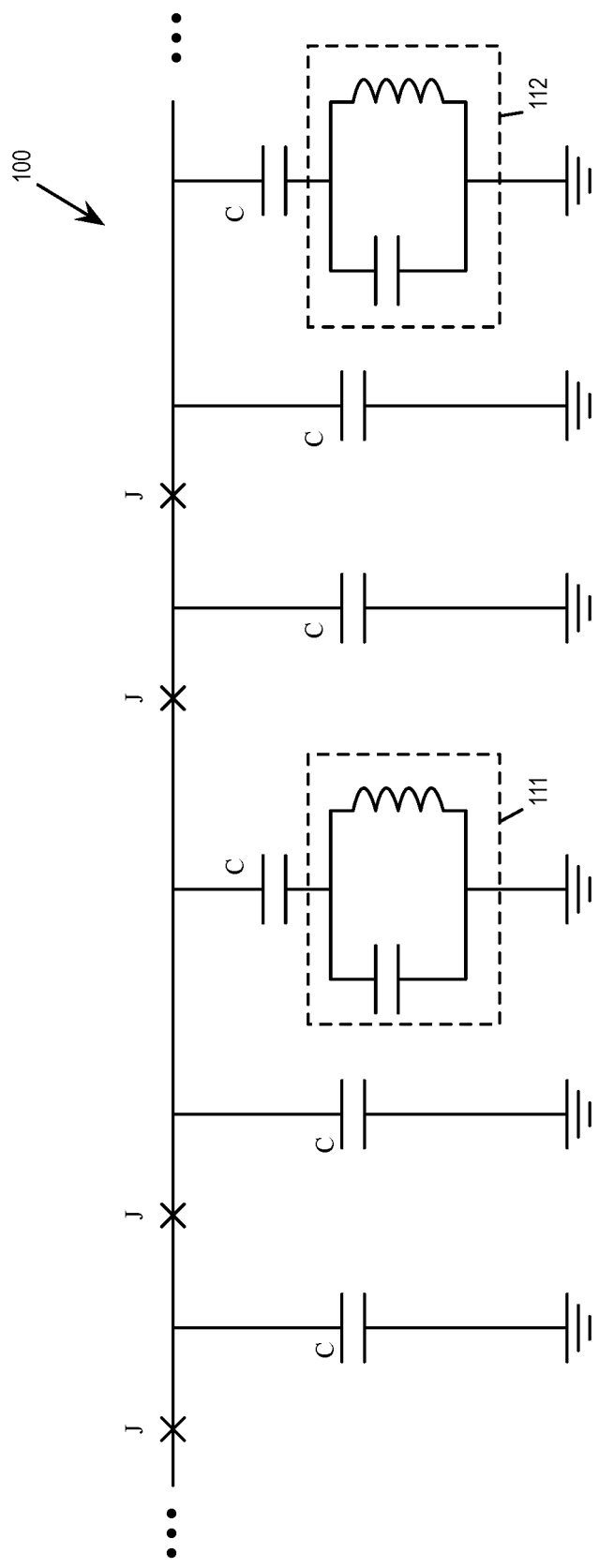
FIG. 1 illustrates a traveling wave parametric amplifier (TWPA) transmission line that is interspersed with dispersion resonators for upholding the constraint on conservation of energy and momentum, consistent with an exemplary embodiment.

FIG. 1 illustrates a TWPA 100 that is interspersed with dispersion resonators for upholding the constraint on conservation of energy and momentum, consistent with an illustrative embodiment. As illustrated, the TWPA transmission line 100 is characterized by a chain of Josephson junction inductive elements (labeled 'J') in series with capacitive elements (labeled 'C') to the ground. The TWPA transmission line 100 is also interspersed with periodic dispersion resonators, including resonators 111 and 112 that are coupled to the transmission line 100 by coupling capacitors.

Figure 2A:
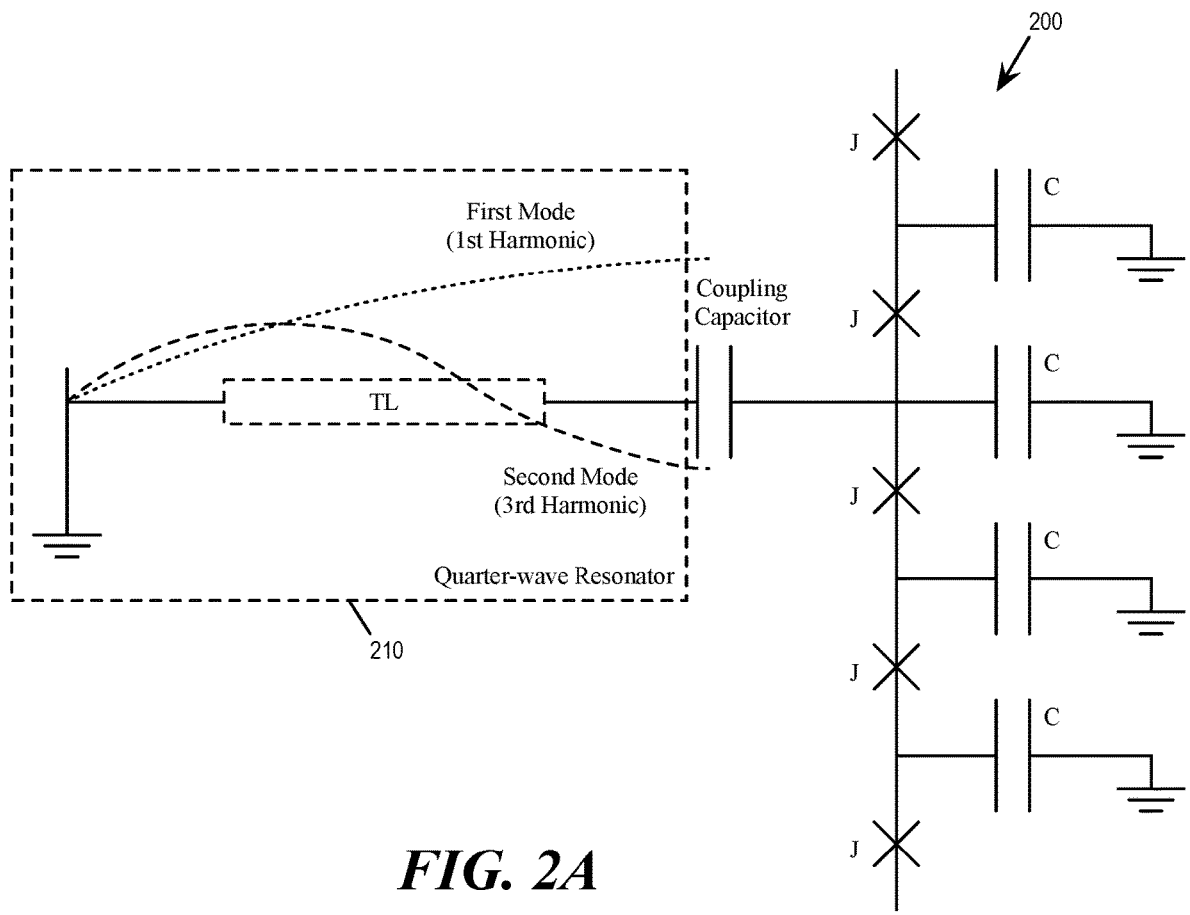
FIGS. 2A-B illustrate an example quarter-wave resonator that is used as a dispersion feature in a TWPA transmission line.
Figure 2B:
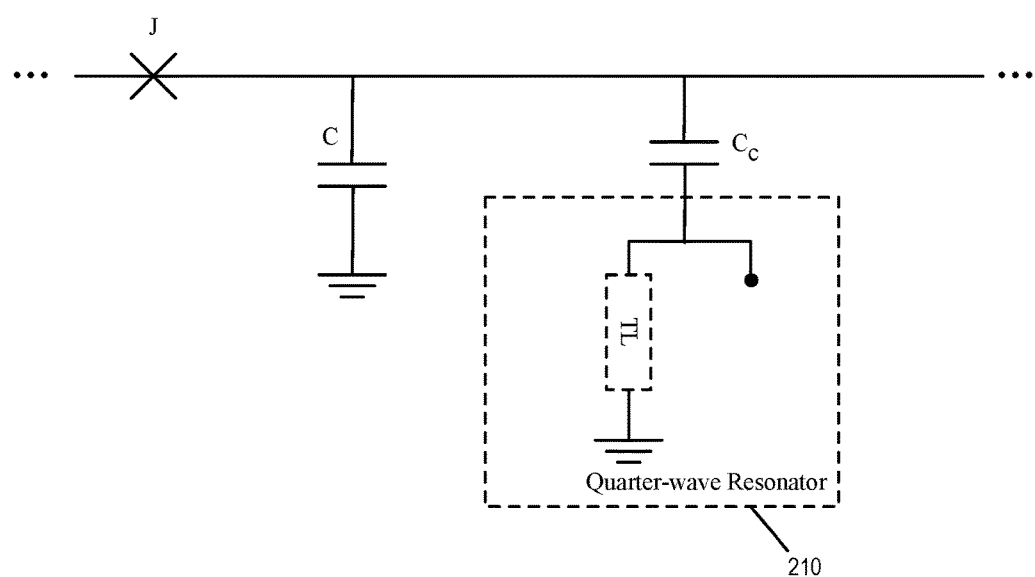

There are multiple different ways of implementing dispersion in a TWPA. FIGS. 2A-B illustrate an example quarter-wave resonator 210 that is used as a dispersion feature in a TWPA transmission line 200. As illustrated, the TWPA transmission line 200 is characterized by a chain of Josephson inductive elements (labeled 'J') and capacitive elements (labeled 'C'). The TWPA transmission line 200 may also be interspersed with periodic dispersion resonators, including the quarter-wave resonator 210. The advantage of this type of dispersion feature is that it is easy to make all the resonators uniform. The challenge with this method is that the quarter-wave resonator has multiple (harmonic) modes.

FIG. 2A shows a first mode (dotted line) and a second mode (dash line) of the quarter-wave resonator 210. The first or lowest mode of the quarter wave resonator (fundamental frequency or the first harmonic) is used for resonant phase matching in TWPA. The next lowest mode (second mode) of the quarter wave resonator is a harmonic at three times the fundamental frequency, or the third harmonic. (If a half-wave resonator were to be used, the second mode would be twice the fundamental frequency, or the second harmonic.) In this TWPA implementation, there is a dip in gain that reduces the usable bandwidth of the TWPA. This dip occurs at where the second mode of the dispersion resonator 210 phase matches the generation of higher-order intermodulation products.

Figure 3:
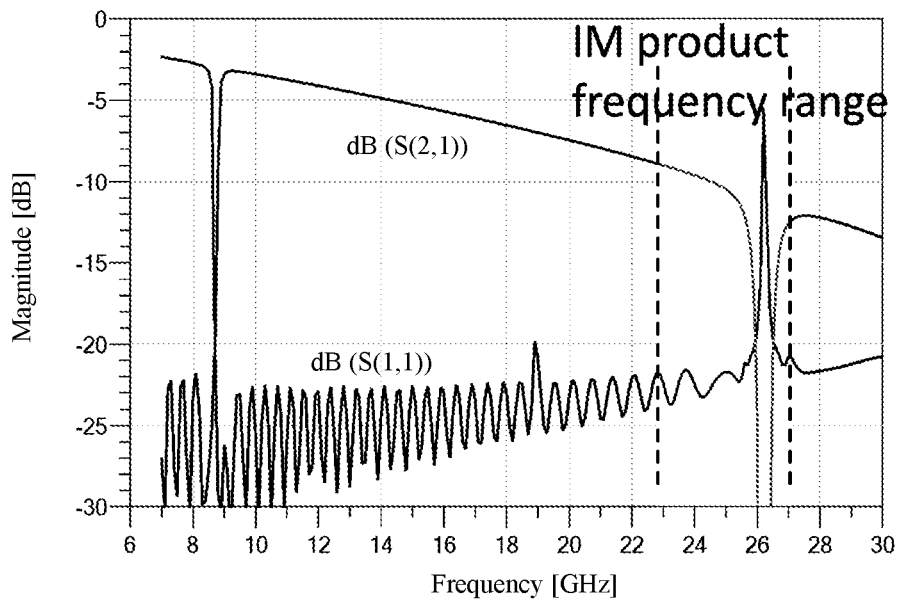
FIG. 3 shows the dip in transmission at the second mode of the dispersion resonator for an unpumped TWPA.
Figure 4:
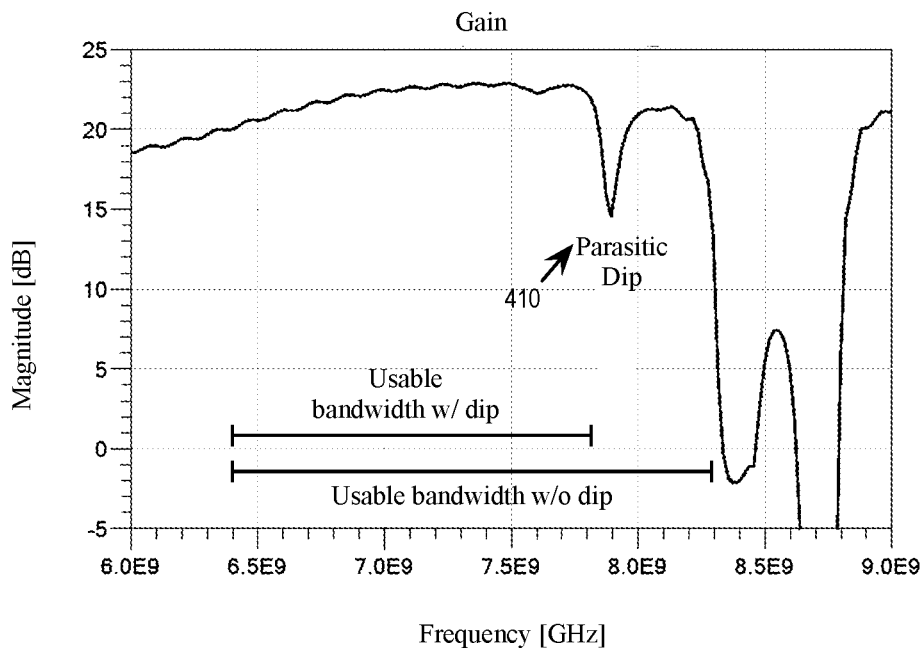
FIG. 4 shows the dip in gain due to the second mode of the dispersion resonator for a pumped TWPA.

FIGS. 3 and 4 show plots of the performance of the TWPA 200, based on parameter values shown in FIG. 2B. FIG. 3 shows the dip in transmission at the second mode of the dispersion resonator for an unpumped TWPA. The figure includes a plot of a simulation of scattering parameters of an unpumped TWPA with a dispersion resonator at 8.75 GHz. The plot also shows the interaction with the second mode at 26 GHz. FIG. 4 shows the dip in gain at the second mode of the dispersion resonator for a pumped TWPA. The figure includes a simulation of scattering parameters of the TWPA when pumped at 8.55 GHz. As illustrated in FIGS. 3 and 4, around 8.5 GHz, two usual dips in gain can be observed due to the stopband generated by the dispersion resonator around the pump frequency. However, there is an additional gain dip around 7.9 GHz due to the generation of IM products around the second mode of the dispersion resonator.

During the parametric amplification process, undesired tones are also generated at intermodulation products of the signal and pump frequency. Unfortunately, the higher harmonic of the dispersion resonator can have a parasitic interaction with the intermodulation (IM) products, increasing coupling to the IM products such as $\omega_{IM3}=2\omega_p+\omega_s$ and $\omega_{IM5}=4\omega_p-\omega_s$ ($\omega_{IM3}$ and $\omega_{IM5}$ are the angular frequency of the third and fifth order intermodulation productions). This occurs for phase matching conditions (i) $k_{IM3}=2k_p+k_s$ and (ii) $k_{IM5}=2k_p+k_i$ (where $k_{IM3}$, and $k_{IM5}$ are the wavevector of the third and fifth order intermodulation productions). This shows up in the device as a dip in the gain at the signal frequency $f_s$ (as shown by a dip 410 in FIG. 4 labeled "parasitic dip"). This dip reduces the usable signal bandwidth of the device by up to 300 MHz or more which limits the range of readout frequencies compatible with the TWPA. Also, since the dip frequency is dependent on the pump frequency $f_p$, this limits the range of useable pump frequencies compatible with a desired bandwidth.

Some embodiments of the disclosure provide methods for eliminating this dip in signal gain of the TWPA. In some embodiments, the dip in gain is eliminated by removing or suppressing the coupling to the second (or higher) harmonic. Specifically, by coupling the resonator to the transmission line at a voltage node of the second mode. This prevents the transmission line from interacting with the second mode of the dispersion resonator, thereby avoiding the dip in gain. This method is also referred to as nodal coupling method.

Figure 5A:
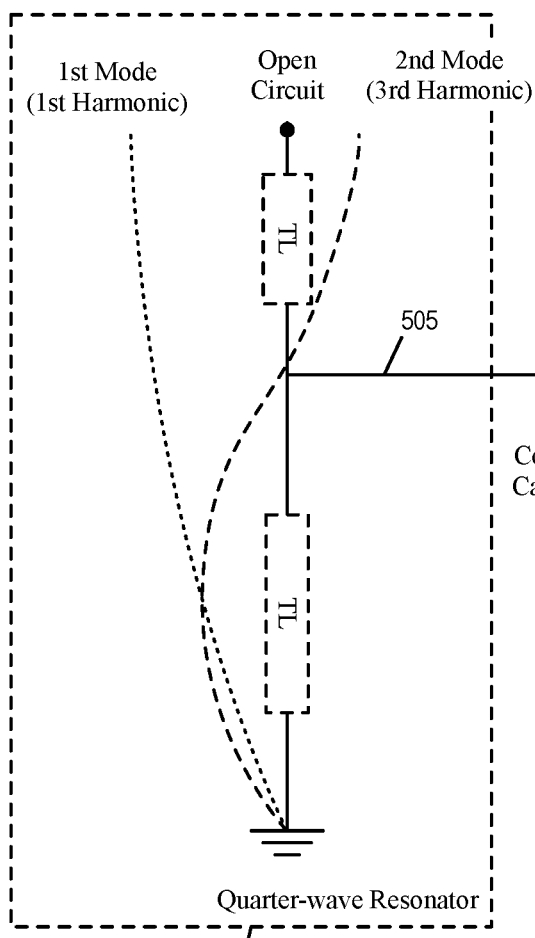
FIGS. 5A-B conceptually illustrate harmonic suppression by nodal coupling, consistent with an illustrative embodiment.
Figure 5A:
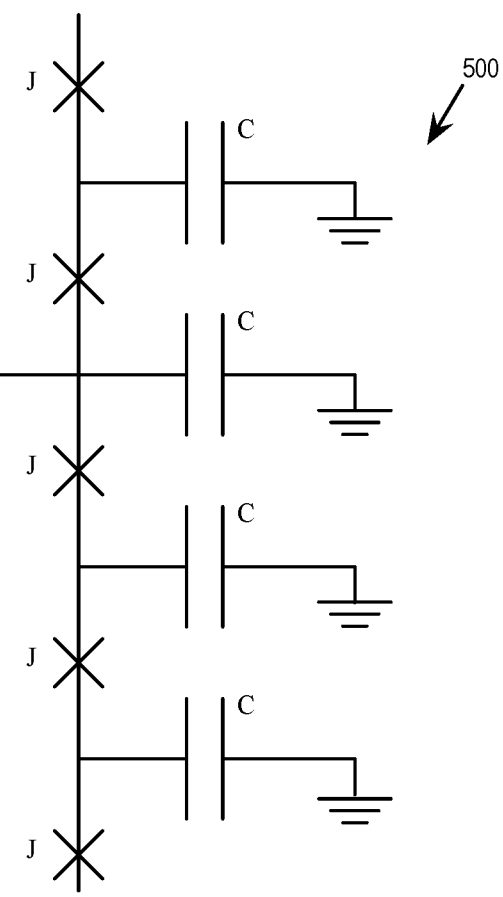
Figure 5B:
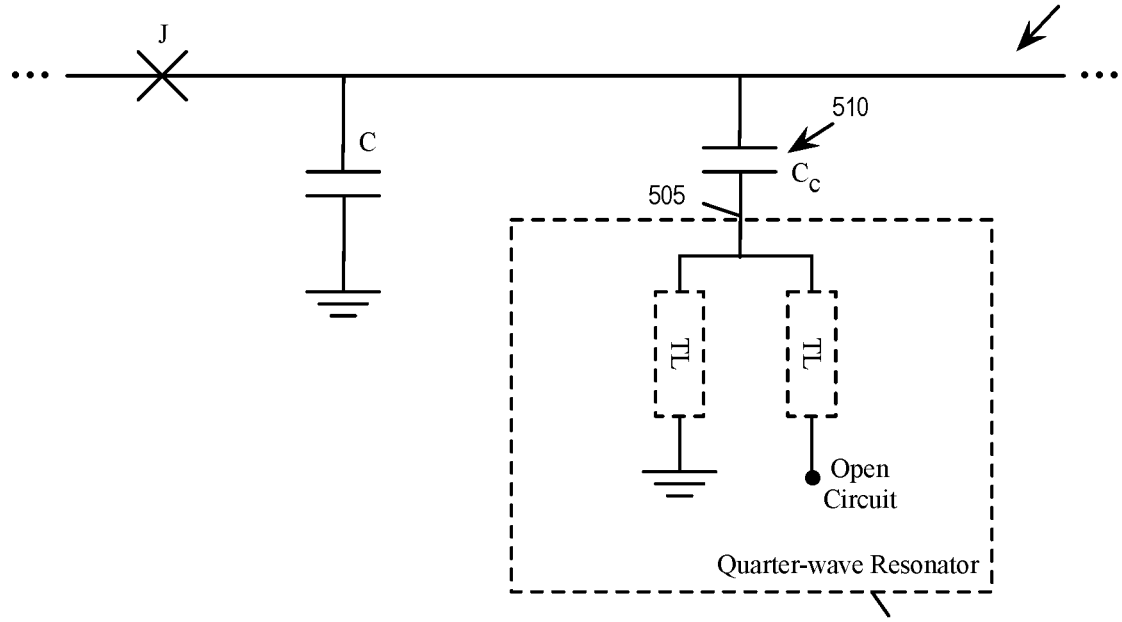

FIGS. 5A-B conceptually illustrate harmonic suppression by nodal coupling. The figure shows a TWPA transmission line 500 that is characterized by a chain of Josephson inductive elements (labeled 'J') and capacitive elements (labeled 'C'). The TWPA transmission line 500 is also interspersed with periodic dispersion resonators, such as a quarter-wave resonator 520. As illustrated, the quarter-wave resonator 520 is coupled to the TWPA transmission line 500 at a voltage-node of the second mode 505 by a coupling capacitor 510. Because of this nodal coupling, the intermodulation products in the transmission line 500 cannot interact with the second mode of the resonator, thus removing the parasitic gain dip. (Alternatively, the nodal coupling can be accomplished by having the resonator inductively coupled to the transmission line at a current node of the second mode.)

Figure 6:
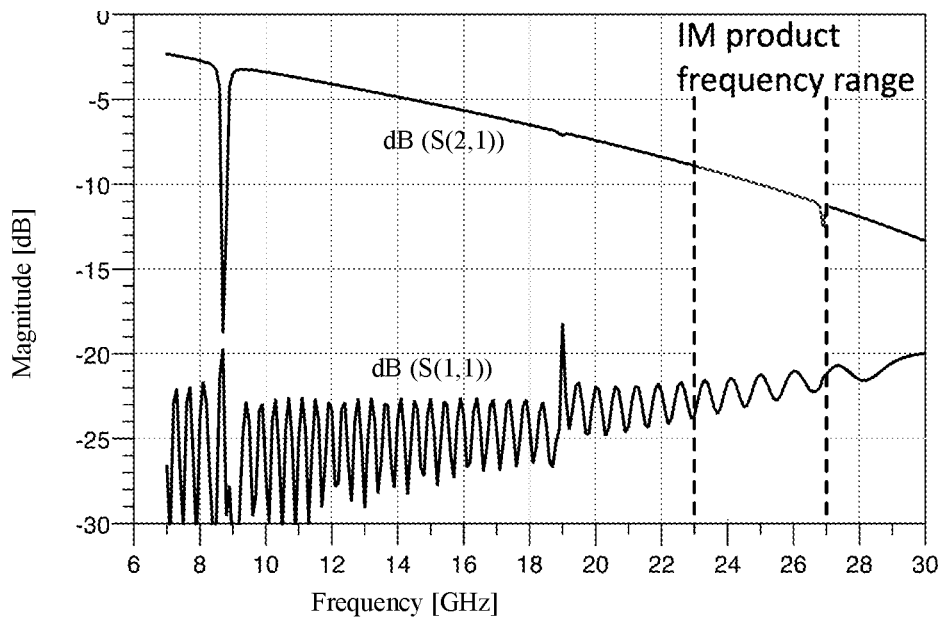
FIG. 6 shows the removal of the dip in transmission in the TWPA by the nodal coupling, consistent with an illustrative embodiment.
Figure 7:
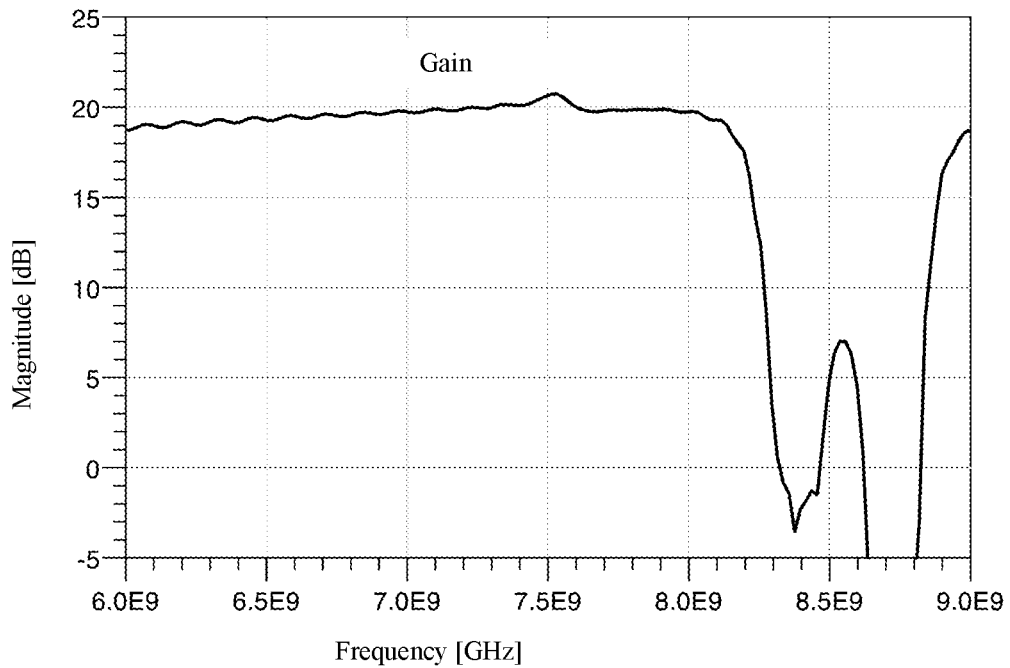
FIG. 7 shows the removal of the dip in gain for a pumped TWPA by nodal coupling, consistent with an illustrative embodiment.

FIGS. 6 and 7 show respective corresponding plots of FIGS. 3 and 4 in which the dip in gain in the TWPA is removed by nodal coupling. The plots are of the simulations that are performed based on parameter values shown in FIG. 5B. FIG. 6 shows the removal of the dip in transmission in the TWPA by the nodal coupling. The figure includes a plot of a simulation of scattering parameters of an unpumped TWPA (the TWPA 500) with a dispersion resonator at 8.75 GHz, but with the second mode node (e.g., voltage node 505) coupled. As illustrated, the first harmonic of the dispersion resonator is still at 8.75 GHz. but the dip at 26 GHz due to the second mode is greatly reduced. FIG. 7 shows the removal of the dip in gain for a pumped TWPA (the TWPA 500) by nodal coupling. The figure includes a simulation of scattering parameters of the TWPA when the TWPA is pumped for gain at 8.55 GHz, but with the second mode node coupled. As illustrated, the dip in gain at 7.9 GHz due to the second mode of the dispersion resonator has disappeared.

In some embodiments, the dip in gain is eliminated by configuring the dispersion resonator to detune or decoupling the second or higher harmonic by several GHz, while maintaining the ease of fabrication and uniformity of the quarter wave resonator. Specifically, by replacing the quarter wave resonator with an inductor in parallel with a Richard's transformation equivalent of a capacitor to form a $\frac{1}{8}^{th}$ wavelength transmission line resonator. The $\frac{1}{8}^{th}$ wavelength transmission line resonator is therefore also referred to as a Richard's transformation resonator.

Figure 8A:
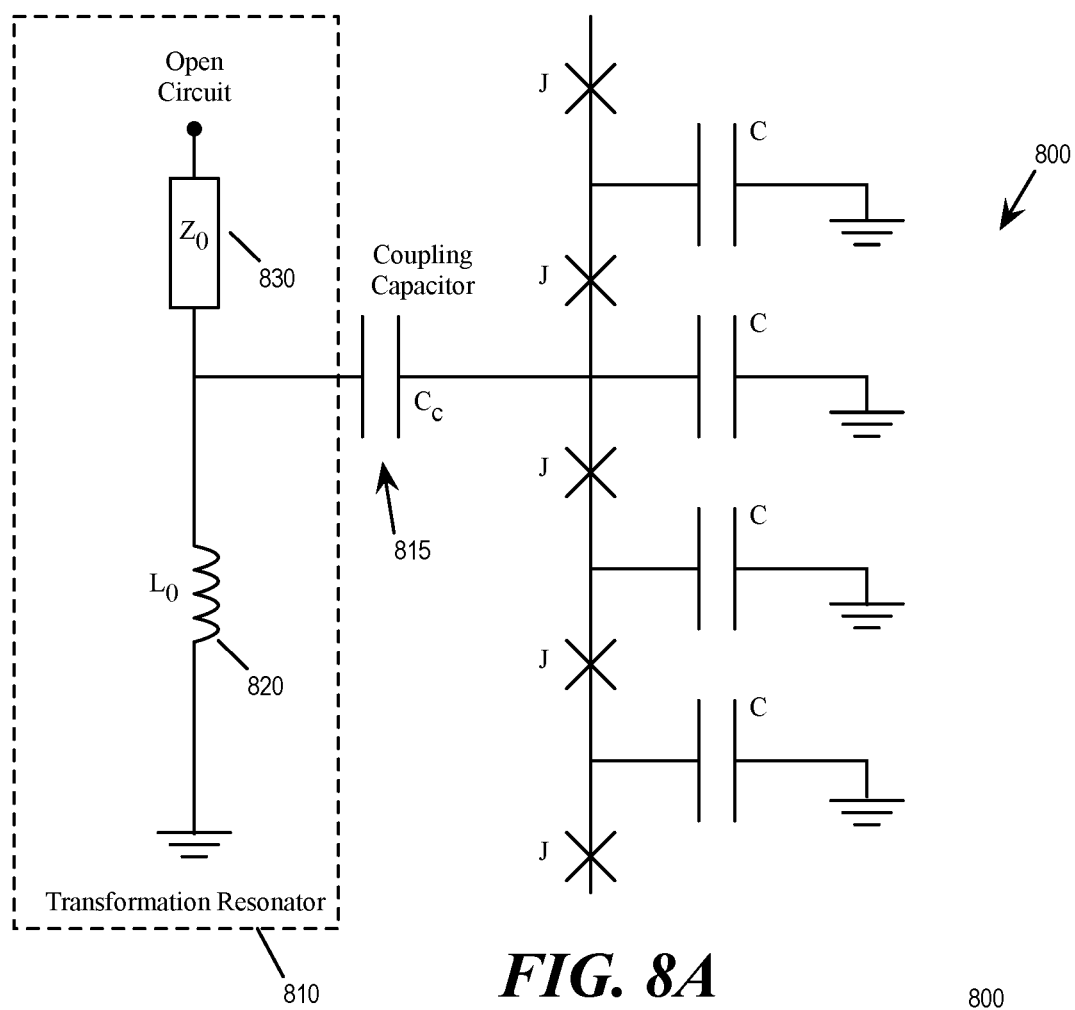
FIGS. 8A-B show an example $\frac{1}{8}^{th}$ wavelength transmission line resonator, consistent with an illustrative embodiment.
Figure 8B:
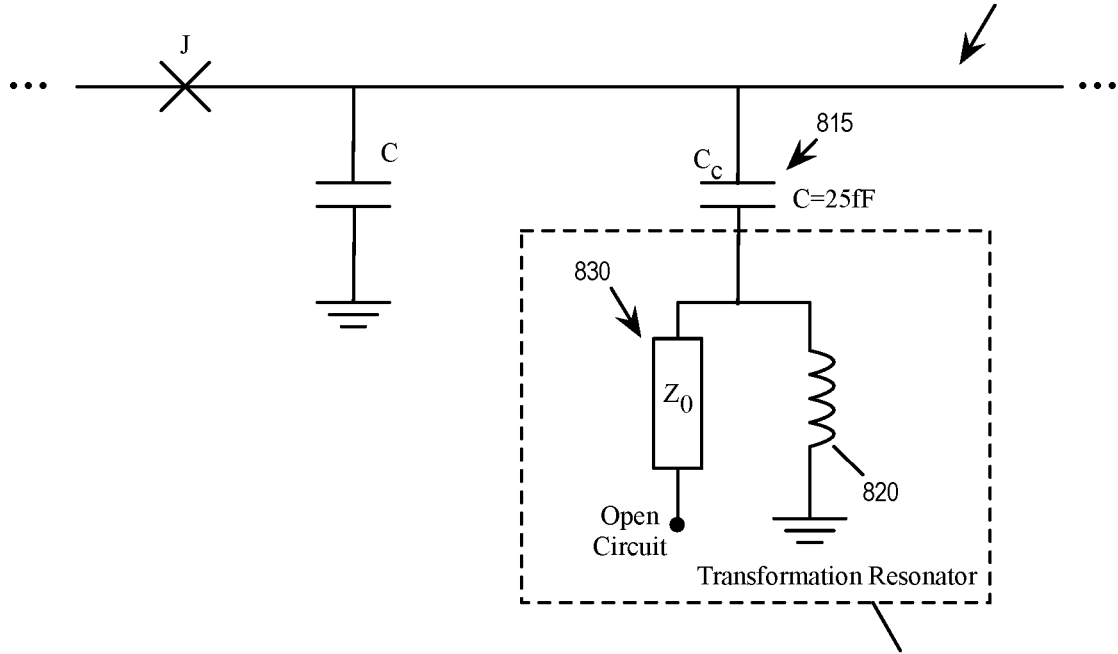

FIGS. 8A-B show an example $\frac{1}{8}^{th}$ wavelength transmission line resonator. The figure shows a TWPA transmission line 800 that is characterized by a chain of Josephson inductive elements (labeled 'J') and capacitive elements (labeled 'C'). The TWPA transmission line 800 is also interspersed with periodic dispersion resonators, such as a transformation resonator 810. As illustrated, the TWPA 800 is coupled to the transformation resonator 810 through a coupling capacitor 815. The transformation resonator 810 is formed by an inductor 820 (to the ground) in parallel with an open-circuited, $\frac{1}{8}^{th}$ wavelength transmission line 830. The open circuit transmission line 830 effectively acts as a capacitor shunted to ground, therefore also a transformation equivalent capacitor. This method is therefore also referred to as Richard's transformed resonator method. The higher modes of this resonator structure are no longer aligned with the IM products of the parametric process in the TWPA transmission line 800, thereby avoiding the dip in gain. This method has an additional benefit of reducing the length of the transmission line section and therefore the overall footprint of the resonator.

The inductor 820 and the transformation equivalent capacitor 830 are parametrized to detune or decouple the second (or higher) harmonic. Specifically, when combined in parallel with the inductor 820 to form the resonant circuit 810, the first (harmonic) mode of the open circuit transmission line 830 is at a desired or target dispersion frequency. The effective capacitance $C_0$ of the open circuit transmission line 830 is set by the line's characteristic impedance $Z_0$ and the desired dispersion frequency $\omega_{res}$ of the resonator. Specifically:

$$C_0 = \frac{1}{Z_0 \omega_{res}} \qquad (1)$$

The inductance in the resonator (e.g., the inductor 820) is set according to:

$$L = \frac{1}{\omega_{res}^2 C_0} \qquad (2)$$

These values may be modified by the value of the coupling capacitance $C_c$ (e.g., the capacitance of the coupling capacitor 815).

Figure 9:
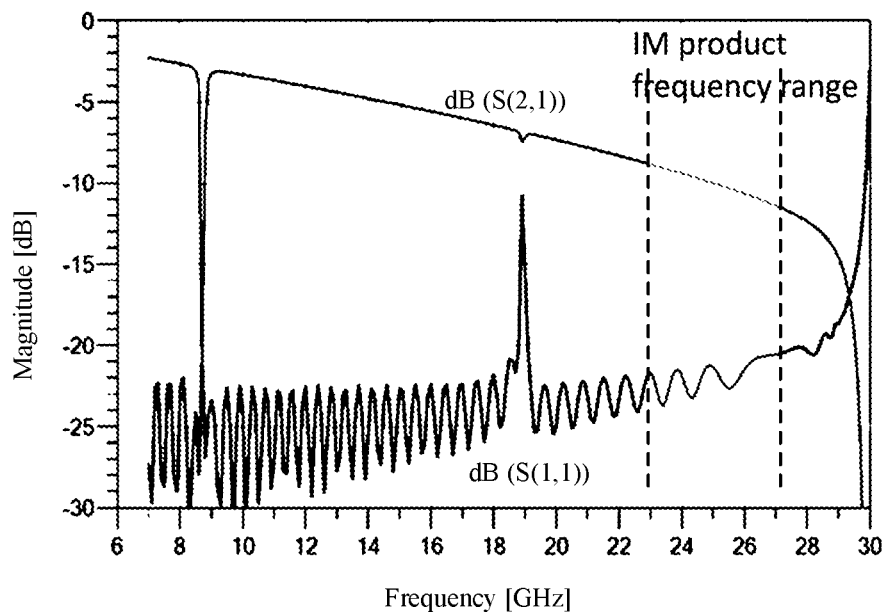
FIG. 9 shows the removal of the dip in transmission in an unpumped TWPA by transformation resonators.
Figure 10:
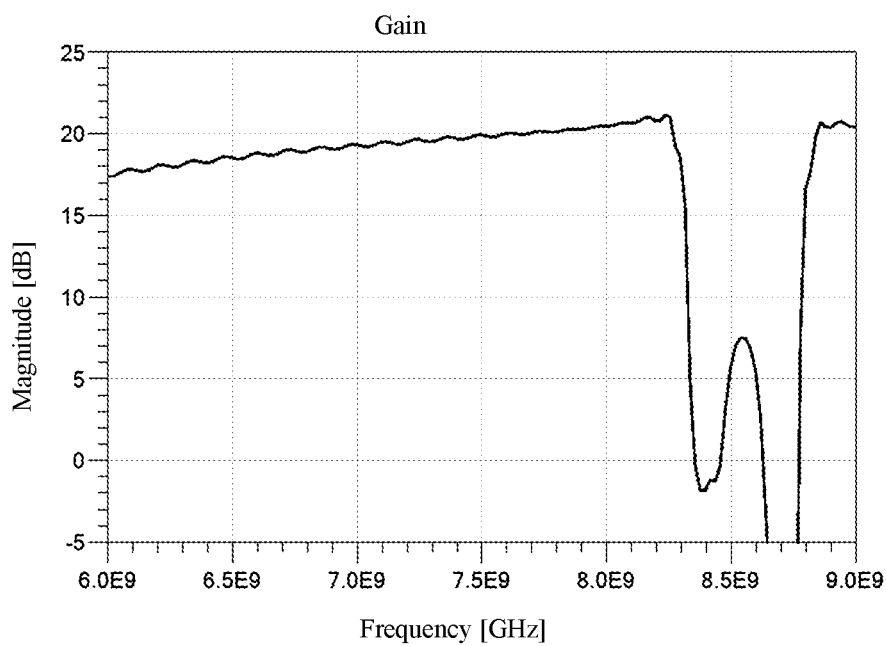
FIG. 10 shows the removal of the dip in gain for a pumped TWPA by transformation resonators.

FIGS. 9 and 10 show respective corresponding plots of FIGS. 3 and 4 in which the dip in gain in the TWPA 800 is removed by Richard's transformation resonators. The plots are of the simulations that are performed based on parameter values shown in FIG. 8B. FIG. 9 shows the removal of the dip in transmission in an unpumped TWPA by Richard's transformation resonators. The figure includes a plot of a simulation of scattering parameters of an unpumped TWPA with a dispersion resonator at 8.75 GHz, but now the dip due to the second mode is moved from 27 GHz in the range of IM products to greater than 30 GHz outside the range of IM products. FIG. 10 shows the removal of the dip in gain for a pumped TWPA by Richard's transformation resonators. As illustrated, when the TWPA is pumped for gain (e.g., 8.55 GHz), the dip at 7.9 GHz has disappeared.

TWPAs can be useful for scaling up quantum computers. By using either the nodal coupling method (described by reference to FIGS. 5-7 above) or the transformed resonator method (described by reference to FIGS. 8-10), the dip in gain can be removed or pushed out of range of IM products, thereby increasing the usable readout bandwidth of the TWPA. Increasing the usable readout bandwidth of the TWPA can either be used to increase the number of multiplexed qubit measured with a single TWPA or to space the readout resonators further apart to reduce crosstalk. Removing the gain dip facilitates the detuning between the readout resonators and the qubits to reduce Purcell loss in the quantum system. (The Purcell effect is the enhancement or loss of a quantum system's spontaneous emission rate by its environment.)

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An apparatus comprising:
   a transmission line comprising one or more unit cells, each unit cell comprising a capacitor to a ground and a Josephson junction in series configured to provide inductance and non-linearity; and
   one or more resonators coupled to the transmission line, each resonator configured to (i) use a first mode of the resonator for resonant phase matching in the transmission line and (ii) prevent a second mode of the resonator from interacting with an intermodulation product of the transmission line.

2. The apparatus of claim 1, wherein the resonator is configured to remove or suppress a coupling of the second mode between the transmission line and the resonator in a frequency range of the intermodulation product of the transmission line.

3. The apparatus of claim 1, wherein the resonator is coupled to the transmission line at a voltage-node of the second mode of the resonator via a coupling capacitor.

4. The apparatus of claim 3, wherein the resonator is a quarter-wave resonator, the first mode is a fundamental frequency of the resonator, and the second mode is a third harmonic of the fundamental frequency of the resonator.

5. The apparatus of claim 1, wherein the resonator is coupled to the transmission line at a current-node of the second mode of the resonator via inductive coupling.

6. The apparatus of claim 1, wherein the resonator is configured to detune or decouple the second mode by several GHz so that the second mode of the resonator is not aligned with the intermodulation product of the transmission line.

7. The apparatus of claim 1, wherein the resonator comprises an inductor to the ground in parallel with an open circuit transmission line.

8. The apparatus of claim 7, wherein the resonator is a one-eighth wavelength transmission line resonator.

9. The apparatus of claim 7, wherein the open circuit transmission line is a transformation equivalent capacitor that operates as a capacitor shunted to the ground.

10. The apparatus of claim 9, wherein the transformation equivalent capacitor has an effective capacitance that is determined based on (i) a characteristic impedance of the open circuit transmission line and (ii) a target dispersion frequency of the resonator.

11. The apparatus of claim 10, wherein the inductor to the ground has an inductance that is set according to the target dispersion frequency of the resonator and the effective capacitance of the transformation equivalent capacitor.

12. A method comprising:
providing a transmission line comprising one or more unit cells, each unit cell comprising a capacitor to a ground and a Josephson junction in series configured to provide inductance and non-linearity;
coupling one or more resonators to the transmission line; and
configuring the resonator to (i) use a first mode of the resonator for resonant phase matching in the transmission line and (ii) prevent a second mode of the resonator from interacting with an intermodulation product of the transmission line.

13. The method of claim 12, wherein the resonator is configured to remove or suppress a coupling of the second mode between the transmission line and the resonator in a frequency range of the intermodulation product of the transmission line.

14. The method of claim 12, wherein the resonator is a quarter-wave resonator that is coupled to the transmission line at a voltage-node of the second mode of the resonator via a coupling capacitor.

15. The method of claim 12, wherein the resonator comprises, from a voltage node of the second mode, a first transmission line to the ground and a second transmission line to an open circuit.

16. The method of claim 12, wherein the resonator is configured to detune or decouple the second mode by several GHz so that the second mode of the resonator is not aligned with the intermodulation product of the transmission line.

17. The method of claim 12, wherein the resonator is a one-eighth wavelength transmission line resonator that comprises an inductor to the ground in parallel with an open circuit transmission line.

18. The method of claim 17, wherein the open circuit transmission line is a transformation equivalent capacitor that operates as a capacitor shunted to the ground.

19. The method of claim 18, wherein the transformation equivalent capacitor has an effective capacitance that is determined based on (i) a characteristic impedance of the open circuit transmission line and (ii) a target dispersion frequency of the resonator.

20. The method of claim 19, wherein the inductor to the ground has an inductance that is set according to the target dispersion frequency of the resonator and the effective capacitance of the transformation equivalent capacitor.

* * * * *